(12) United States Patent
Takagi

(10) Patent No.: US 11,374,149 B2
(45) Date of Patent: Jun. 28, 2022

(54) METHOD OF MANUFACTURING DISPLAY DEVICE AND SOURCE SUBSTRATE STRUCTURE

(71) Applicant: SAMSUNG ELECTRONICS CO., LTD., Suwon-si (KR)

(72) Inventor: Takashi Takagi, Yokohama (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 146 days.

(21) Appl. No.: 16/851,321

(22) Filed: Apr. 17, 2020

(65) Prior Publication Data
US 2020/0357950 A1  Nov. 12, 2020

(30) Foreign Application Priority Data

May 9, 2019 (JP) .............................. JP2019-089336
Jan. 13, 2020 (KR) ........................ 10-2020-0004312

(51) Int. Cl.
*H01L 33/00* (2010.01)
*H01L 33/24* (2010.01)
*H01L 33/56* (2010.01)

(52) U.S. Cl.
CPC .......... *H01L 33/0095* (2013.01); *H01L 33/24* (2013.01); *H01L 33/56* (2013.01); *H01L 2933/0016* (2013.01); *H01L 2933/0066* (2013.01)

(58) Field of Classification Search
CPC combination set(s) only.
See application file for complete search history.

(56) References Cited

U.S. PATENT DOCUMENTS

| 9,484,332 B2 | 11/2016 | Natarajan et al. |
| 9,991,423 B2 | 6/2018 | Bower et al. |
| 10,177,123 B2 | 1/2019 | Gardner et al. |
| 2005/0269943 A1 | 12/2005 | Hack et al. |
| 2014/0065801 A1* | 3/2014 | Faurie ................. H01L 21/0243 438/478 |
| 2017/0338204 A1* | 11/2017 | Lee ......................... H01L 24/20 |
| 2017/0373046 A1* | 12/2017 | Gardner ............... H01L 25/167 |

(Continued)

FOREIGN PATENT DOCUMENTS

JP 2018-508971 A 3/2018

*Primary Examiner* — Julio J Maldonado
*Assistant Examiner* — Mohammad A Rahman
(74) *Attorney, Agent, or Firm* — Sughrue Mion, PLLC

(57) ABSTRACT

Provided are a method of manufacturing a display device and a source substrate structure. The method of manufacturing the display device includes holding a light-emitting element on a source substrate that passes laser light of a certain wavelength therethrough, the holding being performed by a release layer between the source substrate and the light-emitting element, forming an adhesive layer on a driving substrate on which a driving substrate-side electrode is formed, moving the light-emitting element to a surface of the adhesive layer on the driving substrate from the source substrate by irradiating laser light of the certain wavelength to the release layer through the source substrate, and adhering the moved light-emitting element to the driving substrate by using the adhesive layer, and the release layer comprises a resin material with a thickness that is greater than or equal to 0.1 μm and is less than or equal to 0.5 μm.

3 Claims, 13 Drawing Sheets

(56) References Cited

U.S. PATENT DOCUMENTS

| | | | |
|---|---|---|---|
| 2019/0237438 A1* | 8/2019 | Yoo | H01L 25/0657 |
| 2019/0335594 A1* | 10/2019 | Matsuura | H05K 3/4652 |
| 2020/0006296 A1* | 1/2020 | Sakamaki | H01L 33/507 |
| 2020/0235076 A1* | 7/2020 | Batres | H01L 33/62 |
| 2021/0237497 A1* | 8/2021 | Fior | B41M 3/12 |

* cited by examiner

METHOD OF MANUFACTURING DISPLAY DEVICE AND SOURCE SUBSTRATE STRUCTURE

CROSS-REFERENCE TO RELATED APPLICATIONS

This application claims the benefit of Japanese Patent Application No. 2019-089336, filed on May 9, 2019, in the Japanese Patent Office and Korean Patent Application No. 10-2020-0004312, filed on Jan. 13, 2020, in the Korean Intellectual Property Office, the disclosures of which are incorporated herein in their entireties by reference.

BACKGROUND

1. Field

The disclosure relates to a method of manufacturing a display device and a source substrate structure, and more particularly, to a method of manufacturing a display device and a source substrate structure used to manufacture the display device.

2. Description of Related Art

Recently, micro light-emitting diode (LED) display devices have been in the spotlight. The micro LED display device is a next-generation display device that has a high response speed, causes no burning, and displays a high-luminance and high-precision image at low power.

An example of techniques for manufacturing micro LED display devices is disclosed in Patent Document 1 (Japanese Patent Gazette No. 2018-508971). According to the technique disclosed in Patent Document 1, a light-emitting device (light-emitting element) formed on a growth substrate is first adhered to a transfer substrate (source substrate). Then, in the technique disclosed in Patent Document 1, laser light is irradiated from the transfer substrate and the light-emitting device moves away from the transfer substrate to a backplane substrate (driving substrate). In the technique disclosed in Patent Document 1, adhesion between the transfer substrate and the light-emitting device includes forming a first adhesive layer on the light-emitting device and forming a release layer and a second adhesive layer on the transfer substrate in that order. Then, as the first adhesive layer and the second adhesive layer are adhered together, the light-emitting device is adhered to the transfer substrate.

SUMMARY

Provided is a method of manufacturing a display device in which a remaining film does not remain on a light-emitting device after the light-emitting device is transferred to a driving substrate from a source substrate.

Also provided is a source substrate structure used to manufacture a display device, in which a remaining film does not remain on a light-emitting device after the light-emitting device is transferred to a driving substrate from a source substrate.

Additional aspects will be set forth in part in the description which follows and, in part, will be apparent from the description, or may be learned by practice of the presented embodiments of the disclosure.

A method of manufacturing a display device according to an embodiment of the disclosure includes holding a light-emitting element on a source substrate that passes laser light of a certain wavelength therethrough, the holding being performed by a release layer between the source substrate and the light-emitting element, forming an adhesive layer on a driving substrate on which a driving substrate-side electrode is formed, moving the light-emitting element to a surface of the adhesive layer on the driving substrate from the source substrate by irradiating laser light of the certain wavelength to the release layer through the source substrate, and adhering the moved light-emitting element to the driving substrate by using the adhesive layer, in which the release layer includes a resin material with a thickness that is greater than or equal to 0.1 µm and is less than or equal to 0.5 µm.

The holding of the light-emitting element on the source substrate may include forming an electrode on a semiconductor layer formed on a sapphire substrate, forming a temporary adhesive layer on a surface of the semiconductor layer where the electrode is formed, adhering the surface of the semiconductor layer to a relay substrate through the temporary adhesive layer, removing the sapphire substrate, holding the source substrate, by the release layer, on a surface of the semiconductor layer from which the sapphire substrate is removed, removing the temporary adhesive layer and the relay substrate, dividing the semiconductor layer by removing an unnecessary part of the semiconductor layer, and forming a plurality of light-emitting elements on the source substrate.

An absorption rate of the release layer with respect to the certain wavelength may range from 60% to 100%.

The resin material may include any one selected from a group consisting of polyimide resin, acryl resin, epoxy resin, polypropylene resin, polycarbonate resin, and acrylonitrile butadiene styrene (ABS) resin.

The release layer may include a first release layer including a first resin material formed on the source substrate and a second release layer including a second resin material that is formed on the light-emitting element and is different from the first resin material, and the second resin material may be formed to a thickness of 0.1 µm to 0.5 µm on the light-emitting element.

The holding of the light-emitting element on the source substrate may include providing the source substrate and applying the first resin material to the source substrate to form the first release layer, forming an electrode on a semiconductor layer formed on a sapphire substrate and forming a temporary adhesive layer on a surface of the semiconductor layer on which the electrode is formed, adhering the surface of the semiconductor layer to a relay substrate through the temporary adhesive layer, removing the sapphire substrate, and applying the second resin material to a surface of the semiconductor layer from which the sapphire substrate is removed, to a thickness of 0.1 µm to 0.5 µm after curing, to form the second release layer.

When the absorption rate of the first release layer with respect to the certain wavelength is Wa1 and the absorption rate of the second release layer with respect to the certain wavelength is Wa2, Wa1<Wa2.

The absorption rate of the first release layer with respect to the certain wavelength may be greater than or equal to 1% and less than or equal to 50%, and the absorption rate of the second release layer with respect to the certain wavelength may be greater than or equal to 60% and less than or equal to 100%.

When a thickness of the first release layer is T1 and a thickness of the second release layer is T2, T1>T2.

A thickness of the first release layer may be in a range of 1 µm to 5 µm.

The first resin material may include polydimethylsiloxane (PDMS) resin, and the second resin material may include any one selected from a group consisting of polyimide resin, acryl resin, epoxy resin, polypropylene resin, polycarbonate resin, and acrylonitrile butadiene styrene (ABS) resin.

The certain wavelength may be in a range of 248 nm to 355 nm.

The light-emitting element may include a polygonal shape with a side that is greater than or equal to 1 μm and less than or equal to 100 μm, a circular shape with a diameter that is greater than or equal to 1 μm and less than or equal to 100 μm, or an oval shape with a major axis that is greater than 1 μm and less than or equal to 100 μm and a minor axis that is greater than or equal to 1 μm and less than 100 μm.

A source substrate structure according to an embodiment of the disclosure may include a source substrate through which laser light of a certain wavelength passes, a light-emitting element, and a release layer between the source substrate and the light-emitting element, the light-emitting element being held onto the source substrate by the release layer in which the release layer includes a resin material with a thickness that is greater than or equal to 0.1 μm and is less than or equal to 0.5 μm.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
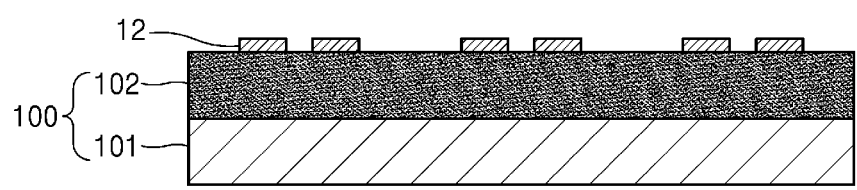
FIG. 1 is a cross-sectional view illustrating a micro light-emitting diode (LED) forming process in a method of manufacturing a display device according to an exemplary embodiment.

Hereinafter, embodiments of the disclosure will be described in detail with reference to the accompanying drawings. In the following drawings, like reference numerals indicate like components, and throughout the drawings, the size of each component may be exaggerated for clarity and convenience of a description. Meanwhile, an embodiment of the disclosure described below is merely an example, and various modifications may be made from the embodiment of the disclosure.

Throughout the disclosure, the expression "at least one of a, b or c" indicates only a, only b, only c, both a and b, both a and c, both b and c, all of a, b, and c, or variations thereof.

Hereinbelow, "above" or "on" may include not only contacting "on", but also contactless "on".

The singular forms are intended to include the plural forms as well, unless the context clearly indicates otherwise. When it is assumed that a certain part "includes" or "has" a certain component, the term 'including' means that a corresponding component may further include other components unless a specific meaning opposed to the corresponding component is written.

The use of "the" and other demonstratives similar thereto may correspond to both a singular form and a plural form.

Operations of a method are performed in a proper order unless the order is mentioned clearly or otherwise. The order of the operations is not limited to the order the operations are mentioned. The use of all examples or exemplary terms (e.g., "etc.,", "and (or) the like", and "and so forth") is merely intended to described technical spirit in detail, and the scope is not necessarily limited by the examples or exemplary terms unless defined by the claims.

First Embodiment

A method of manufacturing a display device according to a first embodiment of the disclosure will be described.

FIGS. 1 through 6 are cross-sectional views of a source substrate structure illustrating a micro light-emitting diode (LED) forming process in a method of manufacturing a display device.

The micro LED forming process in the method of manufacturing a display device includes forming a semiconductor layer 102 that becomes a micro LED (light-emitting element) on a substrate 101, as shown in FIG. 1. The substrate 101 may be, for example, a sapphire substrate. The semiconductor layer 102 emits light of a certain wavelength as an LED. The semiconductor layer 102 may include a GaN-based semiconductor that grows on the substrate 101. In this operation, the semiconductor layer 102 is not divided in the form of a separate micro LED. In the current embodiment of the disclosure, the substrate 101 and the semiconductor layer 102 may be collectively referred to as an initial substrate 100.

The substrate 101 may have, for example, a 4-inch wafer size.

On the semiconductor layer 102, an electrode may be formed in a position corresponding to each micro LED after division. In the current embodiment of the disclosure, this electrode will be referred to as an LED-side electrode 12 (light-emitting element side electrode). Division into the micro LEDs will be described later.

The LED-side electrode 12 may be formed for each part, which is to be a micro LED after division, on the semiconductor layer 102. The LED-side electrode 12 may use a part of a metal wire electrically connected with the semiconductor layer 102 or may be formed as a metal pad directly contacting the semiconductor layer 102.

The LED-side electrode 12 may include, for example, at least one of any one metal among Au, Ag, Cu, Al, Pt, Ni, Cr, Ti, and indium tin oxide (ITO) or graphene. Among them, at least one of Au, Ag, or Cu is preferred.

Figure 2:
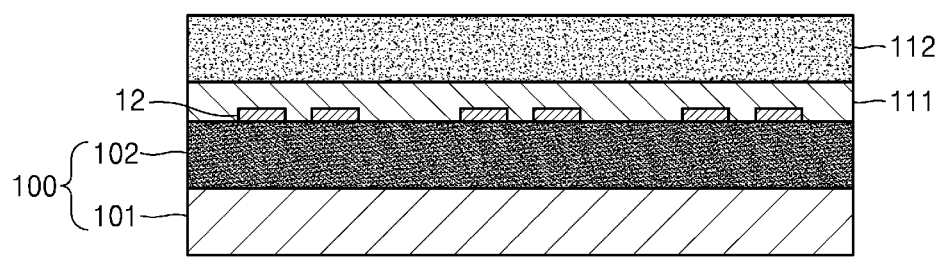
FIG. 2 is a cross-sectional view illustrating a micro LED forming process in a method of manufacturing a display device according to an exemplary embodiment.

As shown in FIG. 2, a relay substrate 112 is adhered by a transferring resin layer 111 to a surface of the initial substrate 100 on which the LED-side electrode 12 is formed. The transferring resin layer 111 may be a temporary adhesive layer. This process may be performed as below. On a surface of the relay substrate 112, which opposes the initial substrate 100, the transferring resin layer 111 may be formed by spin coating, etc. The initial substrate 100 and the relay substrate 112 may be bonded with each other. Then, the transferring resin layer 111 may be cured by heating process, and the initial substrate 100 and the relay substrate 112 are adhered. As the relay substrate 112, for example, a quartz glass substrate may be used.

For the transferring resin layer 111, a resin material may be used in which an absorption rate of laser light wavelength used in laser lift off to be described later after curing of the resin material is more than or equal to about 60% and less than or equal to about 100%. The transferring resin layer 111 may include a resin material having an absorption rate of laser light wavelength of about 80% or more and about 100% or less. For the resin material, for example, any one resin selected from a group consisting of polyimide resin, acryl resin (e.g., polymethyl methacrylate (PMMA)), epoxy resin, polypropylene (PP) resin, polycarbonate resin, and acrylonitrile butadiene styrene (ABS) resin may be used. When the resin described above is used, a thermal curing agent may be mixed. For the transferring resin layer 111, other thermal curing agent may be used.

The resin material and light may have a relationship: transmittance (%)=100%−absorption rate (%)−reflectivity (%). Thus, for the wavelength of the laser light used for laser lift off, the absorption rate of the laser light wavelength may be obtained from the relationship. The resin material may be selected from specifications (e.g., transmittance, absorption rate, reflectivity) of an available resin material or characteristics (e.g., transmittance, absorption rate, reflectivity) of the resin material to achieve the absorption rate of the laser light wavelength.

Figure 3:
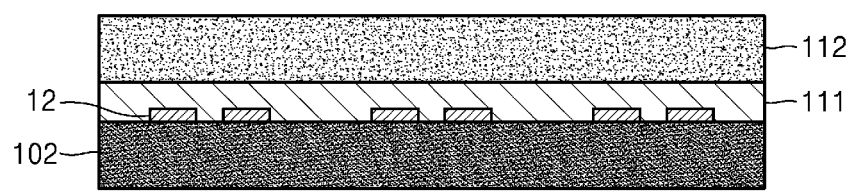
FIG. 3 is a cross-sectional view illustrating a micro LED forming process in a method of manufacturing a display device according to an exemplary embodiment.

As illustrated in FIG. 3, the substrate 101 may be separated from the semiconductor layer 102. Separation of the substrate 101 may use, for example, a laser lift off technique. For example, the entire surface may be irradiated from the side of the substrate 101, and laser light of an infrared wavelength may be irradiated. By irradiation of the laser light, the substrate 101 may be separated from the semiconductor layer 102. For the laser light, for example, KrF excimer laser of a wavelength of 248 nm may be used. The used wavelength is not limited thereto as long as the wavelength may separate the substrate 101 from the semiconductor layer 102.

Figure 4:
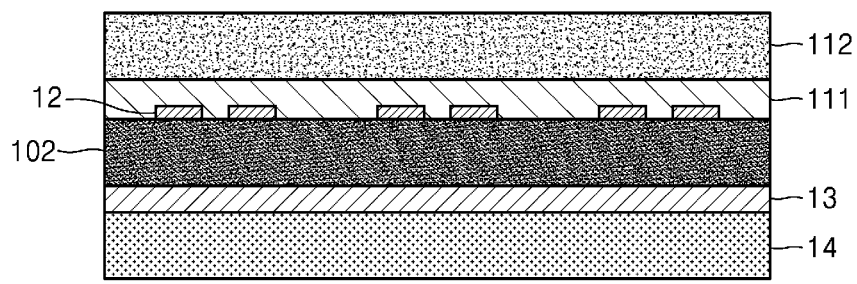
FIG. 4 is a cross-sectional view illustrating a micro LED forming process in a method of manufacturing a display device according to an exemplary embodiment.

As illustrated in FIG. 4, a source substrate 14 is bonded to the semiconductor layer 102 through a release layer 13. The release layer 13 is also referred to as a dynamic release layer (DRL). This process may be performed as below. First, a resin material that is to form the release layer 13 is formed in the side of the semiconductor layer 102 by spin coating, etc. Then, the source substrate 14 is bonded to the resin material. By heating, the resin material is cured to form the release layer 13 to which the source substrate 14 is adhered.

The source substrate 14 pass the wavelength of the laser light used for laser ablation to be described later. As the source substrate 14, for example, a quartz glass substrate may be used. The quartz glass substrate may have, for example, a size that is the same as or larger than that of the substrate 101, and more specifically, when the substrate 101 is a 4-inch wafer, a 4-inch wafer may also be used for the source substrate 14 (e.g., quartz glass substrate).

The release layer 13 may be formed by adjusting an application thickness according to a curing contraction rate of a material such that the thickness of the resin material after curing is more than or equal to about 0.1 µm and less than or equal to about 0.5 µm. For example, when the curing contraction rate of the used resin material is 70%, the application thickness may be equal to or more than about 0.14 µm and less than or equal to about 0.7 µm. The application thickness of the resin material may be determined in advance by experiment, etc., such that the resin material of the release layer 13 has a thickness in the foregoing thickness range after curing.

As the release layer 13, the resin material may be used such that after curing of the resin material, an absorption rate of a certain wavelength of the laser light used in laser ablation is more than or equal to about 60% and less than or equal to about 100%. For example, the release layer 13 may be such that the absorption rate of the laser light wavelength is more than or equal to about 80% and less than or equal to about 100%. The certain wavelength will be described later.

The resin material and light may have a relationship: transmittance (%)=100%−absorption rate (%)−reflectivity (%). Thus, for the wavelength of the laser light used for laser ablation, the absorption rate of the certain wavelength may be obtained from the relationship. The resin material may be selected from specifications (e.g., transmittance, absorption rate, reflectivity) of an available resin material or characteristics (e.g., transmittance, absorption rate, reflectivity) of the resin material to achieve the absorption rate of the certain wavelength.

For the resin material used for the release layer 13, for example, any one resin selected from a group consisting of polyimide resin, acryl resin (e.g., PMMA), epoxy resin, PP resin, polycarbonate resin, and ABS resin may be used. When the resin described above is used, a thermal curing agent may be mixed. As the resin material, other thermal curing resin may be used.

Figure 5:
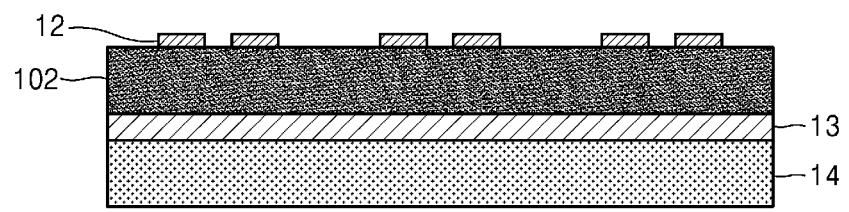
FIG. 5 is a cross-sectional view illustrating a micro LED forming process in a method of manufacturing a display device according to an exemplary embodiment.

As shown in FIG. 5, the relay substrate 112 may be removed. To remove the relay substrate 112, for example, the laser lift off technique may be used. Removal of the relay substrate 112 may be performed as below, for example. To irradiate the entire surface from the side of the relay substrate 112, laser light of an infrared wavelength may be irradiated. Thus, the transferring resin layer 111 may be melt by irradiation of the laser light and the relay substrate 112 may be separated and removed from the surface of the LED-side electrode 12. The transferring resin layer 111 remaining on the surface of the LED-side electrode 12 may be removed by washing. For the laser light, for example, KrF excimer laser of a wavelength of 248 nm may be used. However, the wavelength is not limited thereto, and may be properly determined depending on the resin material used for the transferring resin layer 111.

Figure 6:
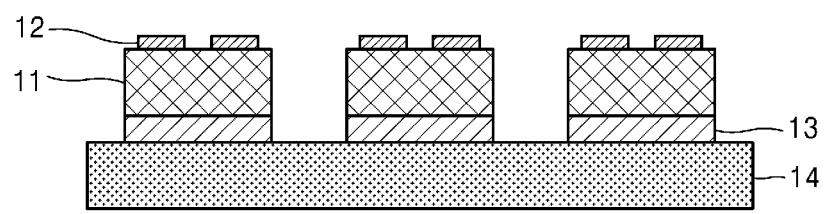
FIG. 6 is a cross-sectional view illustrating a micro LED forming process in a method of manufacturing a display device according to an exemplary embodiment.

As illustrated in FIG. 6, the semiconductor layer 102 may be divided into a plurality of micro LEDs 11. For example, a photoresist may be formed on the semiconductor layer 102 and patterned by photolithography, and the semiconductor layer 102 may be divided into the plurality of micro LEDs 11 through dry etching by using the patterned photoresist as a mask. The release layer 13 may be patterned into the same shape as the micro LEDs 11 by using the divided micro LEDs 11 as a mask. The dry etching used may be reactive ion etching (RIE) that is anisotropic etching.

The chip shape of the micro LED 11 may be a polygonal shape with a side being greater than or equal to about 1 μm and less than or equal to about 100 μm in size, when a surface on which the LED-side electrode 12 is formed is viewed as a plane. For example, the chip shape of the micro LED 11 may be a rectangular shape with a side being greater than or equal to about 1 μm and less than or equal to about 100 μm in size. The height of the micro LED 11, i.e., the thickness of the semiconductor layer 102 may be less than or equal to about 500 μm. Thus, the shape of the micro LED 11 may have length×width×height=100 μm or less×100 μm or less×500 μm or less. A lower limit of each of the length, the width, and the height may be, but not limited to, about 1 μm, and the micro LED 11 may have any size allowing manufacturing thereof. The shape of the micro LED 11 may be a circular shape or an oval shape. When the micro LED 11 is divided into a circular shape, the micro LED 11 may have a diameter of about 1 μm or more and 100 μm or less; when the micro LED 11 is divided into an oval shape, the micro LED 11 may have a major axis that exceeds 1 μm and 100 μm or less and a minor axis of 1 μm or more and less than 100 μm. Also in this case, a lower limit of a diameter is not limited to about 1 μm, and the micro LED 11 may have any size allowing manufacturing thereof.

The micro LEDs 11 arranged on the source substrate 14 may have a minimum interval (space) allowing manufacturing thereof as long as they are surely separated from each other. For this reason, an arrangement pitch may vary with the size of the micro LED 11 and may be, for example, about 200 μm or less. The arrangement pitch may be a distance between centers of adjacent micro LEDs or a distance between edges in the same direction of adjacent micro LEDs.

In the first embodiment of the disclosure, in the foregoing process, by the one-layer release layer 13 between the source substrate 14 and the micro LED 11, a source substrate structure is provided in which the micro LED 11 is held onto the source substrate 14.

Figure 7:
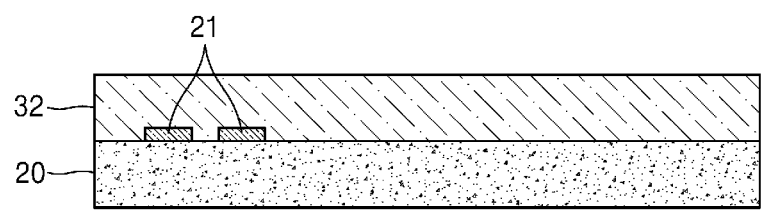
FIG. 7 is a cross-sectional view illustrating a driving substrate in a method of manufacturing a display device according to an exemplary embodiment.

A driving substrate will be described. FIG. 7 is a cross-sectional view illustrating a driving substrate in a method of manufacturing a display device.

The driving substrate 20 may have a size corresponding to a size of a display device to be manufactured.

On the driving substrate 20, an electrode for connecting with the LED-side electrode 12 may be formed together with a wire needed for supplying power to the micro LED 11, a thin film transistor (TFT), etc. In the current embodiment of the disclosure, the electrode installed on the driving substrate 20 will be referred to as a driving substrate-side electrode 21. The driving substrate-side electrode 21 may use a part of a metal wire formed on the driving substrate 20 or formed as a metal pad connected with the wire. For the driving substrate-side electrode 21, the same metal as used for the LED-side electrode 12 may be used.

In the first embodiment of the disclosure, an adhesive layer 32 may be formed on the surface of the driving substrate 20 on which the driving substrate-side electrode 21 is formed. For the adhesive layer 32, for example, as a nonconductive adhesive, a nonconductive film (NCF), a nonconductive paste (NCP), a nonconductive adhesive (NCA), or the like may be used. For the adhesive layer 32, for example, a mixture of a thermal curing agent with, for example, epoxy resin, acryl resin, polyimide resin, polyacrylic amide resin, polyvinyl alcohol, polyvinyl pyrrolidone, etc., may be used. The adhesive layer 32 is not limited to the foregoing example, and thermal curing resin may be used therefor. For the adhesive layer 32, a photoresist (positive type) may be used.

The adhesive layer 32 is applied by, for example, a laminating scheme, a printing scheme, etc., to the entire surface of the driving substrate 20 on which the driving substrate-side electrode 21 is formed. The thickness of the adhesive layer 32 may be about 1 μm or more and about 50 μm or less. Connection between the micro LED 11 and the driving substrate 20 may include pressurization and heating. In the first embodiment of the disclosure, the thickness of the adhesive layer 32 may have a range of about 1 μm to 50 μm, and the LED-side electrode 12 may reach the driving substrate-side electrode 21 by pressurization and heating.

In the first embodiment of the disclosure, in the process, a driving substrate structure in which the adhesive layer 32 is installed may be provided.

Figure 8:
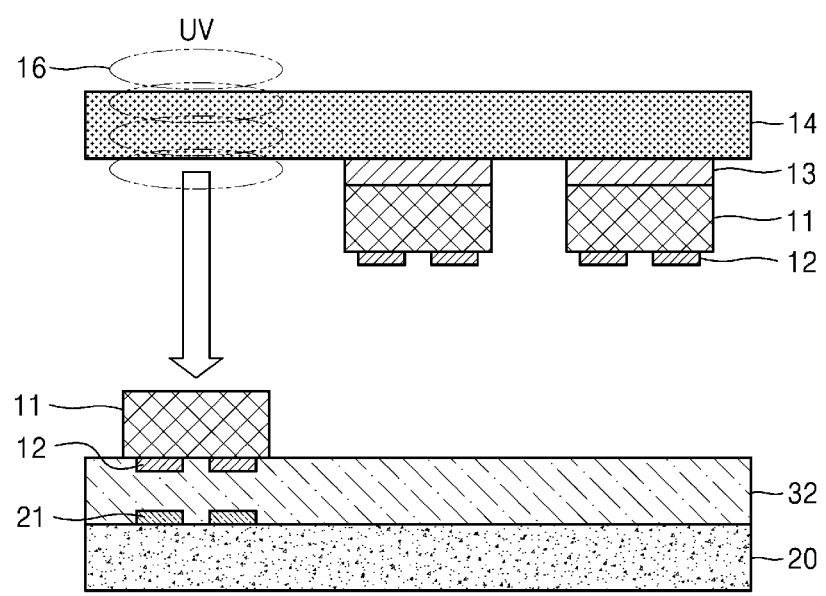
FIG. 8 is a cross-sectional view for describing a method of connecting a micro LED with a driving substrate in a method of manufacturing a display device according to an exemplary embodiment.
Figure 9:
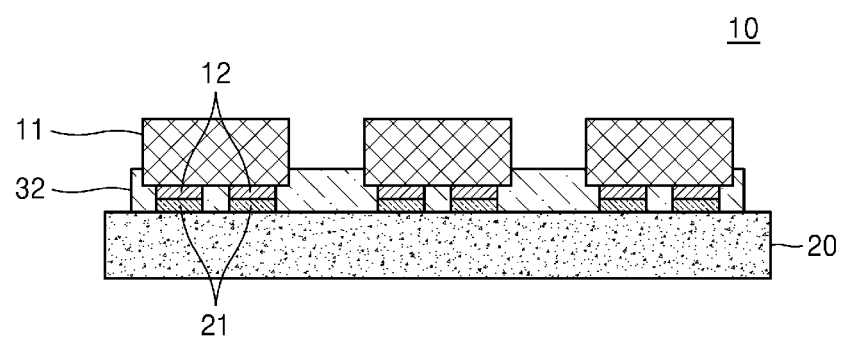
FIG. 9 is a cross-sectional view for describing a method of connecting a micro LED with a driving substrate in a method of manufacturing a display device according to an exemplary embodiment.

Connection between the micro LED 11 and the driving substrate 20 will be described. FIGS. 8 and 9 are cross-sectional views for describing a method of connecting the micro LED 11 with the driving substrate 20 in a method of manufacturing a display device.

The micro LED 11 and the driving substrate 20 may be connected using a laser ablation technique. As shown in FIG. 8, for connection of one micro LED 11 to the driving substrate 20, the source substrate 14 may be moved to determine a position. The LED-side electrode 12 of the micro LED 11 may be moved to a position allowing connection to the corresponding driving substrate-side electrode 21 for driving the LED-side electrode 12.

After the position is determined, laser light 16 of a certain wavelength (e.g., ultraviolet (UV)) may be irradiated to the micro LED 11 from the source substrate 14. As the laser light 16 is irradiated, the release layer 13 holding the micro LED 11 may be decomposed and dissipated and the micro LED 11 may be released to the driving substrate 20. The released micro LED 11 may be caught in the adhesive layer 32 in the side of the driving substrate 20. The certain wavelength of the used laser light 16 may be, for example, about 248 nm, and a laser light source may be a KrF excimer laser. In addition, YAG(FHG) of a wavelength of 266 nm and YAG (THG) of a wavelength of 355 nm may be used as the laser light source. The laser of a wavelength of 355 nm may use a glass substrate instead of a quartz glass substrate, and may be superior in terms of cost of a member and a device. Thus, the certain wavelength may be greater than or equal to about 248 nm and less than or equal to about 355 nm. The laser light of other wavelengths may also be used.

A beam diameter of the laser light 16 may be equal to or greater than the chip size of one micro LED 11. However, the beam diameter of the laser light 16 may have a size that does not affect the adjacent micro LED 11 on the source substrate 14. Thus, the micro LEDs 11 arranged side by side on the source substrate 14 may be selectively transferred to the driving substrate 20.

The beam of the laser light 16 may be one, but a plurality of beams may be simultaneously irradiated with a desired pitch from a plurality of light sources by using a mask, etc. In this way, the plurality of micro LEDs 11 may be transmitted at the same time.

The interval (gap) between the micro LED 11 and the driving substrate 20 in a laser ablation process may have a range of, for example, about 70 µm to about 100 µm. As the interval (gap) has such a range, the micro LED 11 released from the source substrate 14 in the laser ablation process may be caught at a target position of the driving substrate 20. A lower limit of the interval, though depending on an operation precision of a bonding device, is about 70 µm, such that when the source substrate 14 is moved by the bonding device, the source substrate 14 may be moved fast without contacting the driving substrate 20. The interval (gap) may be an interval between possibly close positions in a state where the source substrate 14 and the driving substrate 20 are opposed. The interval between the possibly close positions may be generally positions where the LED-side electrode 12 and the adhesive layer 32 on the driving substrate-side electrode 21 oppose each other. Release of the micro LED 11 from the source substrate 14 and adhesion of the micro LED 11 to the driving substrate 20 by means of laser light may be performed repeatedly as many times as required for the display device.

When as many micro LEDs 11 as required are arranged on the driving substrate 20, the micro LEDs 11 may be pressured toward and closely contact the driving substrate 20, and may be heated. At this time, a pressure may cause the LED-side electrode 12 and the driving substrate-side electrode 21 to be connected with each other. A heating temperature is a temperature at which the adhesive layer 32 is cured. When an NCF, an NCP, or an NCA including thermosetting resin is used, the curing temperature may be 100° C. or higher and 200° C. or lower for a pressure of 1 MPa or higher or 10 MPa or lower according to an applied pressure.

As shown in FIG. 9, the LED-side electrode 12 and the driving substrate-side electrode 21 are electrically connected and thus are conducted, and the micro LED 11 and the driving substrate 20 are adhered by the cured adhesive layer 32.

In the method of manufacturing the display device 10, when there are further needed connection or wiring of surrounding circuits, such a forming or wiring process may be performed and resin molding for protection of the micro LED 11 may be performed to complete the display device 10.

According to the first embodiment of the disclosure, the following effect may be provided.

In the first embodiment of the disclosure, as the release layer 13 in which the source substrate 14 holds the micro LED 11, the resin material is formed to a thickness of about 0.1 µm to about 0.5 µm. As such, the thin release layer 13 is decomposed and dissipated by irradiation of laser light, such that after release from the source substrate 14, resin of the release layer 13 does not remain on the micro LED 11. Thus, the first embodiment of the disclosure may reduce manufacturing cost by avoiding a need for residual film processing or washing after laser ablation.

According to the first embodiment of the disclosure, the residual film does not remain on the micro LED 11, thus preventing degradation of optical characteristics of light emitted from the micro LED 11.

In the first embodiment of the disclosure, the residual film does not remain on the micro LED 11, thus reducing or preventing a contact failure, repellence, etc., in resin molding on the micro LED 11.

In the first embodiment of the disclosure, an absorption rate of laser light on the release layer 13 may be about 60% or higher, thus rapidly decomposing the release layer 13. For this reason, energy of laser light irradiated by laser ablation may be reduced, thus preventing or largely reducing a damage to the micro LED 11 by the laser light.

The first embodiment of the disclosure may reduce energy of laser light irradiated by laser ablation. Thus, the first embodiment of the disclosure may stabilize a transferring position precision when the micro LED 11 is released from the source substrate 14. The laser ablation process may decompose and dissipate the release layer 13 through energy of laser light and may also release the micro LED 11. For this reason, in the laser ablation process, when the energy of the laser light is too strong, the micro LED 11 is released by the strong force and thus a direction in which the micro LED 11 is released may be unstable. Thus, the first embodiment of the disclosure may reduce energy, thus weakening the force of releasing the micro LED 11 and thus stabilizing the direction in which the micro LED 11 is released.

In the first embodiment of the disclosure, the direction in which the micro LED 11 is released is stabilized such that an interval (gap) between the source substrate 14 and the driving substrate 20 may be relatively large. Thus, in the first embodiment of the disclosure, a gap margin may also be large. Thus, when the first embodiment of the disclosure transfers the micro LED 11 to the driving substrate 20 that is larger than the source substrate 14, an operation of continuously moving the source substrate 14 may be relatively easily implemented, thus reducing a processing time.

The first embodiment of the disclosure may reduce energy of laser light irradiated by laser ablation, thereby reducing plasma generated in laser ablation. Thus, a damage to the source substrate 14 caused by plasma may be prevented or reduced. Thus, the first embodiment of the disclosure may reduce manufacturing cost by facilitating reuse of the source substrate 14 after release of the micro LED 11. When the conventional source substrate 14 is reused, the surface damaged by the plasma needs to become a mirror surface through polishing. Thus, in the first embodiment of the disclosure, the damage caused to the source substrate 14 may be prevented or reduced. Thus, in the first embodiment of the disclosure, in reuse of the source substrate 14, polishing may be skipped or the number of times of polishing may be reduced, thereby reducing cost for reusing the source substrate 14.

The first embodiment of the disclosure may reduce energy of laser light irradiated by laser ablation, thereby achieving energy saving of the process. For example, when a display device having a resolution of 4K is manufactured, the micro LED 11 corresponding to about 8 million pixels needs to be transferred to the driving substrate 20. When one pixel includes one RGB micro LED 11, about 24 million micro LEDs 11 may be simply released by laser irradiation. For this reason, the first embodiment of the disclosure may reduce manufacturing cost by reducing energy of laser light.

Second Embodiment

A method of manufacturing a display device according to a second embodiment of the disclosure will be described.

The second embodiment of the disclosure includes two or more layers including different resin materials as release layers between the source substrate 14 and the micro LED 11. The second embodiment of the disclosure is the same as the first embodiment of the disclosure except for components other than the release layer and a manufacturing process of the release layer. For members having the same functions as members described in the first embodiment of the disclosure, the same reference numerals are given, including cases with different arrangements.

Figure 10:
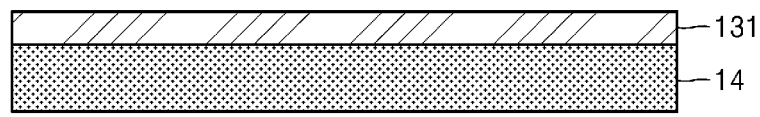
FIG. 10 is a cross-sectional view illustrating a process of adhering a semiconductor layer to a source substrate in a method of manufacturing a display device according to an exemplary embodiment.
Figure 11:
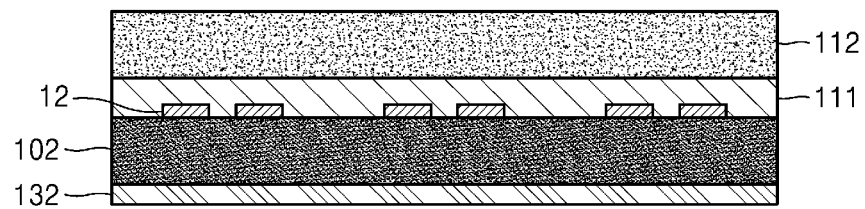
FIG. 11 is a cross-sectional view illustrating a process of adhering a semiconductor layer to a source substrate in a method of manufacturing a display device according to an exemplary embodiment.
Figure 12:
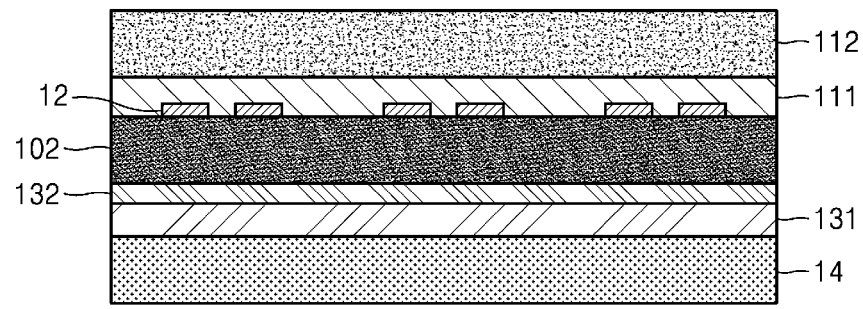
FIG. 12 is a cross-sectional view illustrating a process of adhering a semiconductor layer to a source substrate in a method of manufacturing a display device according to an exemplary embodiment.
Figure 13:
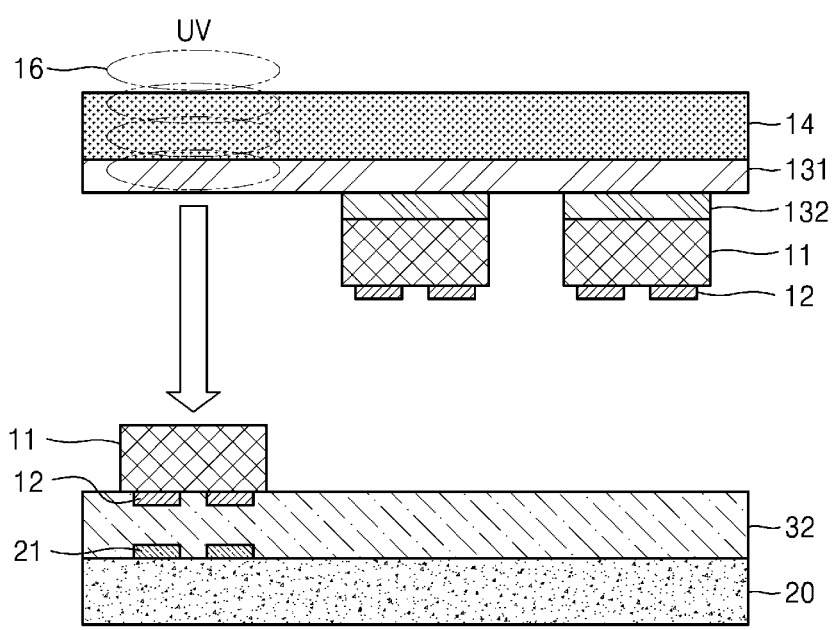
FIG. 13 is a cross-sectional view for describing a method of connecting a micro LED with a driving substrate in a method of manufacturing a display device according to an exemplary embodiment.

FIGS. 10 through 12 are cross-sectional views illustrating a process of adhesion between the semiconductor layer 102 and the source substrate 14 in the second embodiment of the disclosure. FIG. 13 is a cross-sectional view for describing a method of connecting the micro LED 11 with the driving substrate 20 in the second embodiment of the disclosure.

In the second embodiment of the disclosure, as shown in FIG. 10, a first resin material that is to become a first release layer 131 may be applied onto the source substrate 14 before adhesion of the semiconductor layer 102. As the first resin material that is to become the first release layer 131, for example, polydimethylsiloxane (PDMS) resin may be used. A thickness of the first release layer 131 may have a range of about 1 μm to about 5 μm. The first resin material may form the first release layer 131 after being applied and thermally sintered. After the first resin material is cured, the thickness of the first release layer 131 may have a range of about 1 μm to about 5 μm. The thickness of the first release layer 131 has the same value before and after curing because a weight of PDMS resin that is the first resin material before curing and a weight of PDMS resin after curing are different from each other by a measurement limit or less. The thickness of the resin material may vary with the resin material before and after curing. In this case, an application thickness may be adjusted such that the thickness has the foregoing range after curing of the first resin material that is to become the first release layer 131.

The absorption rate of the certain wavelength of the first release layer 131 including the first resin material may have a range of about 1% to about 50%. The certain wavelength may be a wavelength of laser light used for laser ablation like in the first embodiment of the disclosure. Like in the first embodiment of the disclosure, the absorption rate of the certain wavelength of the first resin material may be obtained using a relation of transmittance (%)=100%−absorption rate (%)−reflectivity (%). That is, for the wavelength of the laser light used for laser ablation, the absorption rate of the certain wavelength may be obtained from the relationship. Like in the first embodiment of the disclosure, the first resin material may be selected from specifications (e.g., transmittance, absorption rate, reflectivity) of an available resin material or characteristics (e.g., transmittance, absorption rate, reflectivity) of the resin material to achieve the absorption rate of the certain wavelength.

In the second embodiment of the disclosure, as shown in FIG. 11, a second resin material that is to become a second release layer 132 may be applied onto the semiconductor substrate 102 held onto the relay substrate 112. The second release layer 132 may be formed to adjust the application thickness such that the thickness of the second resin material is equal to or more than about 0.1 μm and less than or equal to about 0.5 μm after curing of the second resin material. For example, when the curing contraction rate of the second resin material is about 70%, the application thickness of the second release layer 132 may be equal to or more than about 0.14 μm and less than or equal to about 0.7 μm. The application thickness of the second resin material may be determined in advance by experiment, etc., such that the second resin material that is to form the second release layer 132 has a thickness having the foregoing range after curing of the second resin material. Thus, the second resin material may have the same composition as the resin material forming the release layer in the first embodiment of the disclosure.

Thus, a thickness relationship between the first release layer 131 and the second release layer 132 may have T1>T2 when the thickness of the first release layer 131 is T1 and the thickness of the second release layer 132 is T2.

The second resin material may have the same resin material as used in the release layer 13 of the first embodiment of the disclosure. That is, for the second resin material, for example, any one resin selected from a group consisting of polyimide resin, acryl resin (e.g., PMMA), epoxy resin, PP resin, polycarbonate resin, and ABS resin may be used. When the resin described above is used, a thermal curing agent may be mixed. As the resin material, other thermal curing resin may be used.

The second release layer 132 may include a material having an absorption rate of a certain wavelength of about 60% to about 100% after curing of the resin material. For example, the second release layer 132 may include a material having an absorption rate of a certain wavelength of about 80% to about 100% after curing of the resin material. The certain wavelength may have a range of about 248 nm to about 355 nm, like in the first embodiment of the disclosure. Like in the first embodiment of the disclosure, the absorption rate of the certain wavelength of the first resin material may be obtained using a relation of transmittance (%)=100%−absorption rate (%)−reflectivity (%). That is, for the wavelength of the laser light used for laser ablation, the absorption rate of the certain wavelength may be obtained from the relationship. Like in the first embodiment of the disclosure, the second resin material may be selected from specifications (e.g., transmittance, absorption rate, reflectivity) of an available resin material or characteristics (e.g., transmittance, absorption rate, reflectivity) of the resin material to achieve the absorption rate of the certain wavelength.

In the second embodiment of the disclosure, the first release layer 131 may be formed in the side close to the source substrate 14, and the second release layer 132 may be formed in the side of the semiconductor layer 102 that is to form the micro LED 11.

The first release layer 131 and the second release layer 132 may have a difference in absorption rate of a certain wavelength, and the absorption rate of the certain wavelength of the first release layer 131 is lower than that of the second release layer 132. That is, a relationship in the absorption rate of the certain wavelength between the first release layer 131 and the second release layer 132 may have $Wa1<Wa2$, when the absorption rate of the certain wavelength of the first release layer 131 is $Wa1$ and the absorption rate of the certain wavelength of the second release layer 132 is $Wa2$.

In the second embodiment of the disclosure, as shown in FIG. 12, the first release layer 131 and the second release layer 132 may oppose each other to bond the source substrate 14 with the relay substrate 112, and pressurization and heating are applied. Thus, the first release layer 131 and the second release layer 132 may be adhered.

Thereafter, in the second embodiment of the disclosure, like in the first embodiment of the disclosure, the relay substrate 112 may be removed by laser lift off and the surface of the semiconductor layer 102 may be washed.

In the second embodiment of the disclosure, like in the first embodiment of the disclosure, the semiconductor layer 102 may be divided into the micro LEDs 11. The second release layer 132 may be divided to the size of the micro LED 11 like in the first embodiment of the disclosure, and the first release layer 131 may be or may not be divided. That is, when the second release layer 132 is etched using the micro LED 11 as a mask, the first release layer 131 may be over-etched.

Thus, in the second embodiment of the disclosure, by the first release layer 131 and the second release layer 132 between the source substrate 14 and the micro LED 11, a source substrate structure is provided in which the micro LED 11 is held onto the source substrate 14.

In the second embodiment of the disclosure, as shown in FIG. 13, each micro LED 11 may be transferred by the laser ablation process. In the second embodiment of the disclosure, the laser ablation process is basically the same as the first embodiment of the disclosure, and laser light of a certain wavelength described in the first embodiment of the disclosure is used.

In the second embodiment of the disclosure, when a certain number of micro LEDs 11 are transferred to the driving substrate 20, pressurization and heating are performed like in the first embodiment of the disclosure. Thus, also in the second embodiment of the disclosure, the micro LED 11 is adhered to the driving substrate 20 and the LED-side electrode 12 and the driving substrate-side electrode 21 are electrically connected and conducted. Also in the second embodiment of the disclosure, necessary connection or wiring of surrounding circuits is performed and for protection of the micro LED 11, resin molding is performed and the display device 10 is completed (see FIG. 9).

According to the second embodiment of the disclosure, the following effect may be provided.

In the second embodiment of the disclosure, the source substrate 14 and the micro LED 11 are held by using two or more release layers (the first release layer 131 and the second release layer 132). The second release layer 132 in the side of the micro LED 11 may have a thickness of about 0.1 μm to about 0.5 μm when the second resin material that is to become the second release layer 132 is applied. For this reason, also in the second embodiment of the disclosure, like in the first embodiment of the disclosure, the residual film is not generated on the micro LED 11 released by the laser ablation process. Thus, residual film processing after laser ablation, or washing is not needed.

In the second embodiment of the disclosure, the absorption rate of the wavelength of the first release layer 131 is more than or equal to about 1% and is equal to or less than about 50%, and the absorption rate of the wavelength of the second release layer 132 is more than or equal to about 60% and is equal to or less than about 100%. Thus, in the second embodiment of the disclosure, even when energy of laser light irradiated by laser ablation is higher than in the first embodiment of the disclosure, the energy may be absorbed by the first release layer 131. For this reason, in the second embodiment of the disclosure, energy of laser light arriving at the micro LED 11 is reduced, stabilizing movement in the release of the micro LED 11 like in the first embodiment of the disclosure. Thus, also in the second embodiment of the disclosure, like in the first embodiment of the disclosure, a gap margin between the source substrate 14 and the driving substrate 20 may be large. Also in the second embodiment of the disclosure, energy of laser light arriving at the micro LED 11 is reduced, thus preventing or largely reducing a damage caused to the micro LED 11 by laser light.

In the second embodiment of the disclosure, by laser ablation, the second release layer 132 divided into the same shape as the individual micro LED 11 may be dissipated, but the first release layer 131 may remain on the source substrate 14. For this reason, in the second embodiment of the disclosure, a surface of the source substrate 14 to which the semiconductor layer 102 is bonded may be protected by the remaining first release layer 131 from plasma generated in laser ablation. Thus, the second embodiment of the disclosure may prevent the source substrate 14 from being damaged by plasma generated in laser ablation. As a result, reuse of the source substrate 14 after release of the micro LED 11 is facilitated, reducing manufacturing cost. When the conventional source substrate 14 is reused, the surface damaged by the plasma needs to become a mirror surface through polishing. Thus, in the second embodiment of the disclosure, the damage caused to the source substrate 14 may be prevented or reduced. Hence, in the second embodiment of the disclosure, in reuse of the source substrate 14, polishing may be skipped or the number of times of polishing may be reduced, thereby reducing cost for reusing the source substrate 14.

Hereinbelow, an example of test-manufacturing the display device 10 will be described.

Example 1

(Manufacturing of Source Substrate)

In Example 1, the semiconductor layer 102 that is to become an LED and the LED-side electrode 12 were on the sapphire substrate 101 having a 4-inch size. The LED-side electrode 12 was a gold (Au) pad directly formed on the semiconductor layer 102. The size of the LED-side electrode (pad) was 30 μm×20 μm. The thickness of the semiconductor layer 102 was about 5 μm.

On the relay substrate 112, the polyimide resin mixed with the thermal curing agent was coated to a thickness of about 10 μm and the transferring resin layer 111 was formed. A quartz glass substrate was used as the relay substrate 112.

Then, the sapphire substrate 101 and the relay substrate 112 were polymerized such that the semiconductor layer 102 and the transferring resin layer 111 contact each other, and were pressurized and heated under 1000N at about 250° C. for about 10 minutes to be bonded together.

Then, KrF excimer laser of a wavelength of 248 nm was irradiated from the sapphire substrate 101 to the entire surface with an energy intensity of about 200 mJ/cm$^2$ to separate the semiconductor layer 102 and the sapphire substrate 101 from each other.

The quartz glass substrate was provided as the source substrate 14 on which polyimide resin mixed with the thermal curing agent was then spin-coated to form a resin layer of a thickness of about 0.15 μm, and the source substrate 14 was then sintered at about 250° C. for one hour in a vacuum oven to form the release layer 13. The polyimide resin was obtained by diluting HD3007 (HD Micro-Systems) at a desired solid density. HD3007 had an absorption rate of about 99% or higher with respect to infrared light of a wavelength of about 248 nm, after curing.

Then, the surface of the semiconductor layer 102 on the relay substrate 112 was polymerized in the release layer 13 of the source substrate 14 and was pressurized and heated under 1000N at about 250° C. for 10 minutes to bond the source substrate 14 and the relay substrate 112 using the bonding device.

Then, KrF excimer laser of a wavelength of 248 nm was irradiated from the relay substrate 112 to the entire surface with an energy intensity of about 200 mJ/cm$^2$ to separate the transferring resin layer 111 and the relay substrate 112 from each other. To remove the transferring resin remaining on the semiconductor layer 102, N-methyl pyrrolidone (NMP) was sprayed to the surface of the transferring resin at about 60° C. for about 60 seconds. Thereafter, the semiconductor layer 102 was rinsed with pure water for about 60 seconds.

The semiconductor layer 102 was then divided into the micro LEDs 11 through dry etching (e.g., RIE). The release layer 13 was etched by oxygen plasma RIE by using the divided micro LEDs 11 as a mask, and was divided to the shape of the micro LED 11.

(Transferring by Laser Ablation)

The driving substrate 20 on which TFTs are arranged on an array at specific intervals and copper (Cu) wiring is connected to the TFTs was provided. A part of the Cu wiring was to become the driving substrate-side electrode 21.

Onto the entire surface on which the driving substrate-side electrode 21 of the driving substrate 20 is arranged, a nonconductive material including epoxy resin and the thermal curing agent was applied to form the adhesive layer 32 using an applicator. The adhesive layer 32 was formed to a thickness of about 5 μm on the driving substrate-side electrode 21.

Then, a surface of the source substrate 14 on which the micro LED 11 is held and a surface of the driving substrate 20 on which the driving substrate-side electrode 21 is arranged were held to oppose each other with an interval of about 100 μm therebetween. The one micro LED 11 to be transferred was determined as a target position of the driving substrate 20.

The micro LED 11 was transferred to the driving substrate 20 by laser ablation. The laser ablation process was performed by irradiating KrF excimer laser of a wavelength of about 248 nm to the one micro LED 11 to be transferred from the source substrate 14 at an irradiation energy intensity of about 100 mJ/cm$^2$. The diameter of the laser light was greater than or equal to the width of the one micro LED 11, such that the laser light was not irradiated to the adjacent micro LED 11.

Thus, the one micro LED 11 was released from the source substrate 14 and was caught at the target position of the driving substrate 20.

In the same manner, the necessary number of micro LEDs 11 were repeatedly transferred on the driving substrate 20.

Then, the micro LEDs 11 were fixed on the driving substrate 20 by pressurization and heating. In pressurization and heating, the entire surface of the driving substrate 20 was pressured to cause the LED-side electrode 12 and the driving substrate-side electrode 21 to contact by passing through epoxy resin which was then thermally cured at a temperature of about 250° C.

In this way, a necessary number of micro LEDs 11 as a display panel were transferred on the driving substrate 20.

The surface of the micro LED 11 after the micro LED 11 being transferred to the driving substrate 20 was observed without being washed. As a result, on the surface of the micro LED 11 after transferring, the residual film of polyimide resin that is the release layer 13 did not exist. In addition, a damage such as a laser mark was not detected on the surface of the micro LED 11.

Example 2

In Example 2, the application thickness of a resin material that is to become the release layer 13 was about 0.5 μm. Other processes and materials were the same as in Example 1.

The surface of the micro LED 11 after the micro LED 11 being transferred to the driving substrate 20 was observed without being washed. As a result, on the surface of the micro LED 11 after transferring, the residual film of polyimide resin that is the release layer 13 did not exist. In addition, a damage such as a laser mark was not detected on the surface of the micro LED 11.

Comparative Example 1

In Comparative Example 1, the application thickness of a resin material that is to become the release layer 13 was about 0.7 μm. Other processes and materials were the same as in Example 1.

The surface of the micro LED 11 after the micro MED 11 being transferred to the driving substrate 20 was observed without being washed. As a result, on the surface of the micro LED 11 after transferring, the residual film of polyimide resin that is the release layer 13 was detected.

Example 3

Example 3 was the same as Example 1 until the semiconductor layer 102 was adhered onto the relay substrate 112.

In Example 3, PDMS resin mixed with a thermal curing catalyst was coated onto the source substrate 14 to a thickness of about 10 μm by using slit coating and was sintered in an oven at 150° C. for one hour, thus forming the first release layer 131.

The first release layer 131 formed by sintering the PDMS resin had an absorption rate of about 35% with respect to UV of a wavelength of about 248 nm.

On the surface of the semiconductor layer 102 adhered onto the relay substrate 112, polyimide resin was formed to a thickness of about 0.1 μm by spin coating and is sintered in a vacuum oven at 250° C. for one hour, thus forming the second release layer 132. The polyimide resin was obtained by diluting HD3007 (HD MicroSystems) at a desired solid density. HD3007 had an absorption rate of about 99% or higher with respect to infrared light of a wavelength of about 248 nm, after curing.

Then, the first release layer 131 and the second release layer 132 were opposed to overlap the source substrate 14 and the relay substrate 112, and were pressurized for bonding at a room temperature of about 20° C. to about 30° C. with a pressure of 10 N/cm$^2$ by using a vacuum bonding device.

Then, like in Example 1, KrF excimer laser of a wavelength of 248 nm was irradiated from the relay substrate 112 to the entire surface with an energy intensity of about 200 mJ/cm$^2$ to separate the transferring resin layer 111 and the relay substrate 112 from each other. Thereafter, NMP was sprayed onto the surface of the transferring resin at about 60° C. for about 60 seconds, and then was rinsed with pure water for about 60 seconds.

The semiconductor layer 102 was then divided into the micro LEDs 11 through dry etching (e.g., RIE). The release layer 13 was etched by oxygen plasma RIE by using the divided micro LEDs 11 as a mask, and was divided to the shape of the micro LED 11.

(Transferring by Laser Ablation)

Transferring based on laser ablation was performed in the same manner as Example 1. That is, the adhesive layer 32 was formed to a thickness of about 5 μm on the driving substrate-side electrode 21.

Then, a surface of the source substrate 14 on which the micro LED 11 is held and a surface of the driving substrate 20 on which the driving substrate-side electrode 21 is arranged were held to oppose each other with an interval of about 100 μm therebetween. The one micro LED 11 for transferring was determined as a target position of the driving substrate 20.

The micro LED 11 was transferred to the driving substrate 20 by laser ablation. The laser ablation process was performed by irradiating KrF excimer laser of a wavelength of about 248 nm to the one micro LED 11 to be transferred from the source substrate 14 at an irradiation energy intensity of about 100 mJ/cm$^2$. The diameter of the laser light was greater than or equal to the one micro LED 11, such that the laser light was not irradiated to the adjacent micro LED 11.

Thus, the one micro LED 11 was released from the source substrate 14 and was caught at the target position of the driving substrate 20.

In the same manner, the necessary number of micro LEDs 11 were repeatedly transferred on the driving substrate 20, and then were fixed on the driving substrate 20 by pressurization and heating. In pressurization and heating, the entire surface of the driving substrate 20 was pressured to cause the LED-side electrode 12 and the driving substrate-side electrode 21 to contact and was then thermally treated in an oven at a temperature of about 200° C. for one hour, thus thermally curing epoxy resin.

In this way, the necessary number of micro LEDs 11 as a display panel were transferred on the driving substrate 20.

Also in Example 3, the surface of the micro LED 11 after the micro LED 11 being transferred to the driving substrate 20 was observed without being washed. As a result, on the surface of the micro LED 11 after transferring, the residual film of polyimide resin that is the release layer 132 did not exist. In addition, a damage such as a laser mark was not detected on the surface of the micro LED 11.

While examples and embodiments of the disclosure have been described, the disclosure is not limited to such examples or embodiments and various modifications may be possible.

In each foregoing embodiment of the disclosure, the LED-side electrode 12 and the driving substrate-side electrode 21 directly contact and thus are bonded together, thus being connected through a metal layer between these electrodes. More specifically, for example, a solder bump is formed in at least one of the LED-side electrode 12 or the driving substrate-side electrode 21. After the micro LED is transferred by laser ablation, a temperature is a reflow temperature of the solder bump in heating for curing the adhesive layer, thus connecting an electrode by a metal layer.

In the second embodiment of the disclosure, on the source substrate 14, the micro LED 11 is held by two release layers including the first release layer 131 and the second release layer 132, instead of which the micro LED 11 may also be held by three or more release layers. When three or more release layers are provided, a manufacturing method includes applying the first resin material that is to become the first release layer to the source substrate 14 and further applying a third resin material that is to become a third release layer thereon.

Herein, the absorption rate of the third resin material with respect to a certain wavelength after curing is different from that of the first release layer 131 and that of the second release layer 132.

By providing three or more release layers, for example, when the energy reduction effect of the laser light is low merely with one release layer, e.g., the first release layer, the third release layer may be further added to further reduce energy. That is, in the second embodiment of the disclosure, the amount of energy of laser light arriving at the micro LED 11 may be controlled by the number of layers of release layers. The absorption rate of the third release layer with respect to the certain wavelength may be about 1% to about 50% like the first release layer 131. However, to surely decompose the second release layer 132, an absorption rate of the first release layer and the third release layer with respect to a certain wavelength may not exceed about 50%.

An embodiment of the disclosure may be possible further with a plurality of release layers. In this case, each release layer may include a different resin material.

In an embodiment of the disclosure, the thickness of the release layer for adhesion between the source substrate and the light-emitting element may be thin and laser light may be irradiated from the source substrate, such that the release layer may be dissipated and the light-emitting element may be emitted from the source substrate. For this reason, the residual film of the release layer may be reduced on the light-emitting element.

In an embodiment of the disclosure, two or more release layers for adhering the source substrate with the light-emitting element may be included. The two or more release layers may include the first release layer including the first resin material and the second release layer including the second resin material that is different from the first resin material. The second resin material including the second release layer on the light-emitting element is applied to a thickness of about 0.1 μm to about 0.5 μm. Thus, in the disclosure, laser light is irradiated from the source substrate such that the second release layer may be dissipated and the light-emitting element may be released. For this reason, the residual film of the release layer does not remain on the light-emitting element.

In addition, various modifications may be made to exemplary embodiments based on features in the claims, and such modifications may also fall within the scope of the disclosure.

What is claimed is:

1. A source substrate structure comprising:
   a source substrate through which laser light of a certain wavelength passes;
   a light-emitting element; and
   a release layer interposed between the source substrate and the light-emitting element, the light-emitting element being held on the source substrate by the release layer,
   wherein the release layer comprises:
   a first release layer formed on and directly adhered to the source substrate and comprising a first resin material, and
   a second release layer formed on and directly adhered to the first release layer and comprising a second resin material different from the first resin material,
   wherein a thickness of the first release layer is greater than a thickness of the second release layer,
   wherein the thickness of the first release layer is in a range of 1 μm to 5 μm, and the thickness of the second release layer is in a range of 0.1 μm to 0.5 μm,
   wherein when an absorption rate of the first release layer formed on and directly adhered to the source substrate with respect to the certain wavelength is Wa1 and an absorption rate of the second release layer formed on and directly adhered to the first release layer with respect to the certain wavelength is Wa2, Wa1<Wa2, and wherein the absorption rate of the first release layer with respect to the certain wavelength is greater than or equal to 1% and less than or equal to 50%, and the absorption rate of the second release layer with respect to the certain wavelength is greater than or equal to 60% and less than or equal to 100%.

2. The source substrate structure of claim 1, wherein the second resin material comprises any one selected from a group consisting of polyimide resin, acryl resin, epoxy resin, polypropylene resin, polycarbonate resin, and acrylonitrile butadiene styrene (ABS) resin.

3. The source substrate structure of claim 1, wherein the first resin material comprises polydimethylsiloxane (PDMS) resin, and the second resin material comprises any one selected from a group consisting of polyimide resin, acryl resin, epoxy resin, polypropylene resin, polycarbonate resin, and acrylonitrile butadiene styrene (ABS) resin.

* * * * *